United States Patent
Ogawa et al.

(10) Patent No.: US 6,806,625 B2
(45) Date of Patent: Oct. 19, 2004

(54) PIEZOELECTRIC CERAMIC COMPOSITION AND PIEZOELECTRIC ELEMENT

(75) Inventors: Tomoyuki Ogawa, Toyama-ken (JP); Katsuhiro Horikawa, Omihachiman (JP); Toshikatsu Hisaki, Shiga-ken (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 10/615,020

(22) Filed: Jul. 9, 2003

(65) Prior Publication Data

US 2004/0021399 A1 Feb. 5, 2004

(30) Foreign Application Priority Data

Jul. 25, 2002 (JP) ........................................ 2000-216122

(51) Int. Cl.$^7$ ............................................. H01L 41/187
(52) U.S. Cl. ..................................................... 310/358
(58) Field of Search .................... 310/358; 252/62.9 PZ, 252/9 R; 501/134–135; H01L 41/18; C04B 35/49

(56) References Cited

U.S. PATENT DOCUMENTS 5,410,209 A * 4/1995 Yamashita et al. .......... 310/334
6,097,133 A * 8/2000 Shimada et al. ............. 310/358
6,545,387 B2 * 4/2003 Lee et al. .................. 310/313 A

FOREIGN PATENT DOCUMENTS

| JP | 63-36584 | * 2/1998 | ........... H01L/41/18 |
| JP | 11-157929 | 6/1999 | |
| JP | 2001-97771 | * 4/2000 | ........... H01L/41/00 |
| JP | 3119101 B2 | 10/2000 | |

* cited by examiner

*Primary Examiner*—Thomas M. Dougherty
*Assistant Examiner*—Karen Addison
(74) *Attorney, Agent, or Firm*—Dickstein, Shapiro, Morin & Oshinsky, LLP.

(57) ABSTRACT

A piezoelectric ceramic composition is expressed by the formula $Pb_\alpha[\{Ni_{w/3}Nb_{1-(w/3)}\}_xTi_yZr_z]O_3$. The B site variables x, y, and z lie in a predetermined region in a ternary diagram. The Ni—Nb molar proportion variable satisfies the relationship $0.85 \leq w < 1.00$. The Pb molar content $\alpha$ is reduced from the stoichiometric ratio to a value satisfying the relationship $0.950 \leq \alpha \leq 0.995$. At least one element selected from the group consisting of Sr, Ca, and Ba may be substituted for about 10 mol percent of the Pb.

19 Claims, 3 Drawing Sheets

PIEZOELECTRIC CERAMIC COMPOSITION AND PIEZOELECTRIC ELEMENT

BACKGROUND OF THE INVENTION

1. Field of the Invention

The present invention relates to piezoelectric ceramic compositions and piezoelectric elements. More specifically, the present invention relates to a piezoelectric ceramic composition suitable for uses requiring a high piezoelectric strain constant $d_{31}$, and to a piezoelectric element, particularly a monolithic piezoelectric element, using the piezoelectric ceramic composition and which is used for piezoelectric devices, such as piezoelectric actuators, buzzers, and sensors.

2. Description of the Related Art

Monolithic piezoelectric elements using a piezoelectric ceramic composition have been widely used for piezoelectric actuators, piezoelectric buzzers, piezoelectric sensors, and the like.

The piezoelectric ceramic composition needs to have a high piezoelectric strain constant $d_{31}$, and Pb{(Ni, Nb), Ti, Zr}$O_3$ materials (hereinafter referred to as PNN-PZT) are known as piezoelectric ceramic compositions having a high piezoelectric strain constant $d_{31}$ and which comprise lead zirconate titanate (hereinafter referred to as PZT) containing a third constituent Pb(Ni, Nb)$O_3$.

Also, this type of piezoelectric ceramic composition needs to have a high mechanical strength to prevent fracture and cracking during manufacture. Accordingly, a PNN-PZT piezoelectric ceramic composition having a high piezoelectric strain constant $d_{31}$ and a high mechanical strength has been proposed in, for example, Japanese Patent No. 3119101.

In the known art, the Ni/Nb content ratio is reduced to be lower than the stoichiometric ratio, that is, 1/2, to reduce the size of the particles constituting the ceramic in order to enhance the mechanical strength,.

Piezoelectric elements using the piezoelectric ceramic composition, which are used for various piezoelectric devices, such as piezoelectric actuators, buzzers, and sensors, require a high piezoelectric strain constant $d_{31}$. However, other quality requirements, such as thermal resistance, depend on the intended use of the piezoelectric devices. For example, some piezoelectric elements may give the thermal resistance a higher priority than the piezoelectric strain constant $d_{31}$, and others may give the piezoelectric strain constant $d_{31}$ a higher priority than the thermal resistance.

In any case, the need for further enhanced piezoelectric characteristics, such as a high piezoelectric strain constant $d_{31}$, arises in order to achieve a piezoelectric device having much higher quality.

In the manufacture of a monolithic piezoelectric element, ceramic sheets having an internal electrode pattern formed of a Ag—Pd conductive paste are layered on one another and contact-bonded to form a laminate, and the laminate is sintered to obtain a piezoelectric ceramic base element. Since the ceramic sheets and Ag are, therefore, sintered together, the Ag is undesirably diffused into the ceramic base element to negatively affect piezoelectric characteristics in the use of the known piezoelectric ceramic composition.

SUMMARY OF THE INVENTION

Accordingly, an object of the present invention is to provide a piezoelectric ceramic composition capable of achieving desired piezoelectric characteristics according to use, and to a piezoelectric element using the piezoelectric ceramic composition.

In general, it is desirable to implant ions into a PNN-PZT piezoelectric ceramic composition so that the content of donor ions $Nb^{5+}$ is higher than that of the acceptor ions $Ni^{2+}$, in order to stably obtain a high piezoelectric strain constant $d_{31}$. However, an implantation of too much excess Nb is liable to lead to the formation of a heterogeneous phase during calcination of a ceramic powder mixture. Accordingly, the amount of implanted Nb needs to be limited to some extent from the viewpoint of the stability of characteristics of the ceramic powder material.

The inventors of the present invention have found, as a result of intensive research, that the piezoelectric strain constant $d_{31}$ of a PNN-PZT piezoelectric ceramic composition can be further increased by implanting Nb, acting as the donor, excessively to some extent and by reducing the Pb molar content by a predetermined amount from the stoichiometric ratio. Also, by setting the component ratios of the piezoelectric ceramic composition in a predetermined range leading to relatively good piezoelectric characteristics, and by reducing the Pb molar content from the stoichiometric ratio, the piezoelectric characteristics can be enhanced more effectively.

To this end, according to one aspect of the present invention, a piezoelectric ceramic composition expressed by the formula $Pb_\alpha[\{Ni_{w/3}Nb_{1-(w/3)}\}_x Ti_y Zr_z]O_3$ is provided, wherein x, y, and z lie on the lines connecting points A(0.10, 0.42, 0.48), B(0.10, 0.48, 0.42), C(0.40, 0.39, 0.21), and D(0.40, 0.33, 0.27) in a ternary diagram or within the region surrounded by the lines, w satisfies the relationship $0.85 \leq w < 1.00$, and α is lower than the stoichiometric ratio.

By reducing the Pb molar content α by a predetermined amount from the stoichiometric ratio, Ni in the composition is precipitated in grain boundaries during firing. Consequently, the Ni/Nb ratio in the composition decreases to increase the Nb content to excess, and, hence, the donor content is made still higher. As a result, the piezoelectric strain constant $d_{31}$ can be increased without the formation of a heterogeneous phase during calcination.

However, an excessively reduced Pb molar content α negatively affects sintering characteristics due to a large difference from the stoichiometric ratio. Accordingly, the Pb molar content α, preferably, satisfies the relationship $0.950 \leq \alpha \leq 0.995$. Alternatively, part of the Pb may be replaced with at least one element selected from the group consisting of Sr, Ca and Ba. Preferably, the amount of the Pb replaced with those elements is about 10 mole percent or less, but not 0 mole percent.

By replacing about 10 mole percent or less of Pb with Sr, Ca or Ba, the donor content is increased to excess, and, consequently, the piezoelectric strain constant $d_{31}$ can be increased, as with the foregoing composition.

According to another aspect of the present invention, a piezoelectric element is provided which comprises a ceramic base element comprising the piezoelectric ceramic composition and an internal electrode disposed in the ceramic base element.

By reducing the Pb molar content α of the piezoelectric ceramic composition to be lower than the stoichiometric ratio, as described above, Ni is further precipitated in grain boundaries to compensate for the diffusion of Ag or other internal electrode constituents into the ceramic base element. As a result, the donor content of the piezoelectric ceramic composition is further increased, so that the deterioration of piezoelectric characteristics due to the internal electrode constituents can be canceled out. Thus, the resulting monolithic piezoelectric element can exhibit excellent piezoelectric characteristics.

The piezoelectric characteristics can be enhanced according to the present invention, by setting the B site variables so as to be suitable for use, and/or by reducing the Pb molar content from the stoichiometric ratio. Thus, the resulting piezoelectric element can exhibit high performance and is suitably used for various types of piezoelectric devices, such as piezoelectric actuators, piezoelectric buzzers, and piezoelectric sensors.

DESCRIPTION OF THE PREFERRED EMBODIMENTS

Embodiments of the present invention will now be described in detail.

Figure 1:
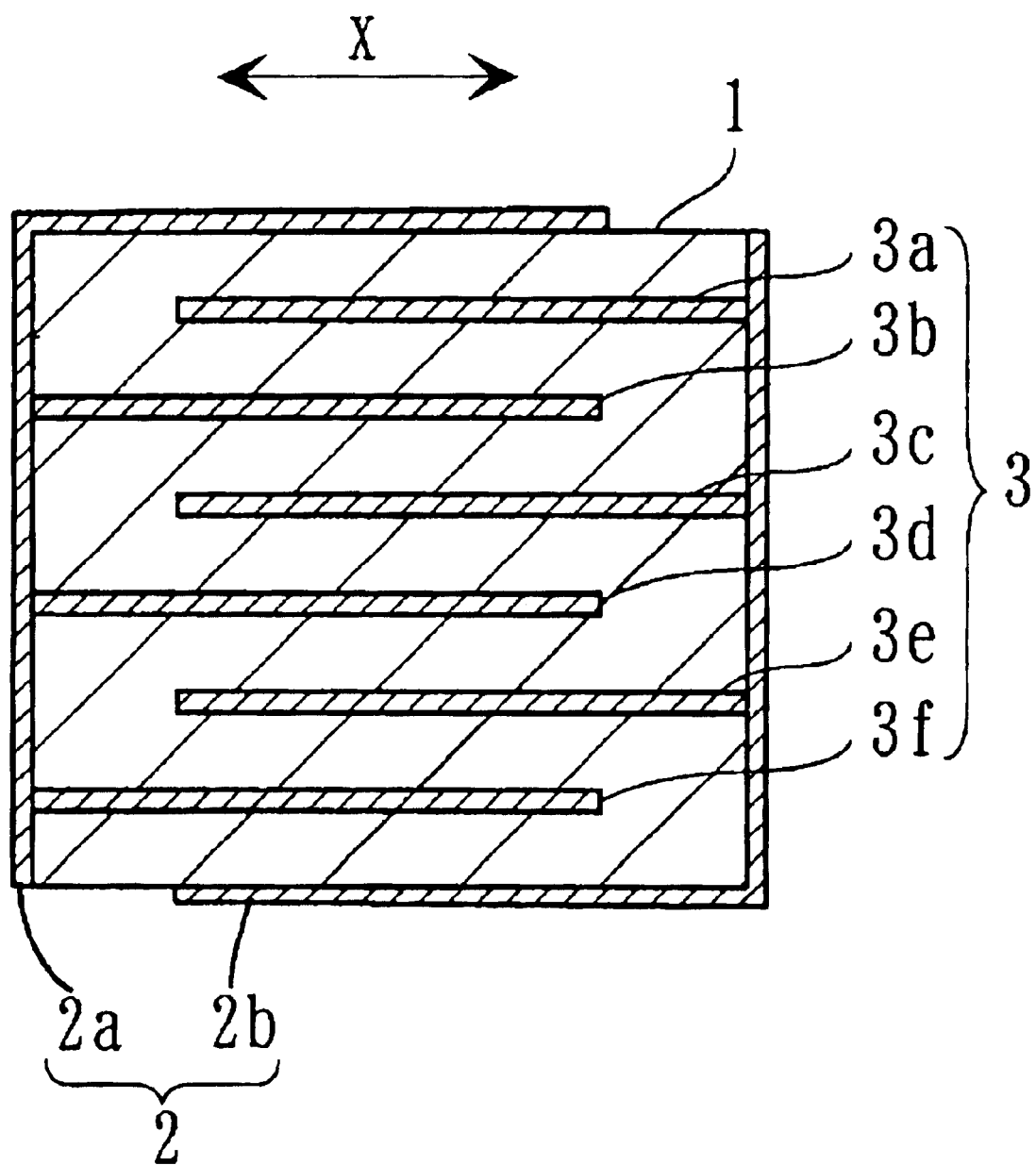
FIG. 1 is a sectional view of a monolithic piezoelectric element according to an embodiment of the present invention.

FIG. 1 is a sectional view of a monolithic piezoelectric element, which is one form of the piezoelectric element of the invention, according to an embodiment of the present invention. The monolithic piezoelectric element includes a piezoelectric ceramic base element 1 and external electrodes 2a and 2b formed of a conductive material, such as Ag. The external electrodes 2a and 2b are disposed on both ends of the piezoelectric ceramic base element 1. The piezoelectric element also includes internal electrodes 3a to 3f formed of a conductive material, such as Ag—Pd. The internal electrodes 3a to 3f are disposed parallel to one another in the piezoelectric ceramic base element 1.

One end of each of internal electrodes 3a, 3c and 3e are electrically connected to one external electrode 2b, and one end of each of the other internal electrodes 3b, 3d and 3f are electrically connected to the other external electrode 2a. When a voltage is applied between the two external electrodes 2a and 2b, the monolithic piezoelectric element is displaced in the longitudinal direction, designated by arrow X, by the piezoelectric longitudinal effect.

The piezoelectric ceramic base element 1 is formed of a PNN-PZT piezoelectric ceramic composition essentially composed of a perovskite complex oxide expressed by the general formula $ABO_3$. The PNN-PZT piezoelectric ceramic composition is expressed by Formula (1):

$$Pb_\alpha[\{Ni_{w/3}Nb_{1-(w/3)}\}_x Ti_y Zr_z]O_3 \quad (1)$$

In formula (1), the compositional variables x, y, and z (hereinafter, collectively referred to as B site variables) respectively represents molar ratios of (Ni, Nb), Ti, and Zr, which constitutes the B site. These B site variables are set on the lines connecting four points A, B, C, and D in the ternary diagram shown in Table 1 and within the region surrounded by the lines.

TABLE 1

| | x | y | z |
|---|---|---|---|
| A | 0.10 | 0.42 | 0.48 |
| B | 0.10 | 0.48 | 0.42 |
| C | 0.40 | 0.39 | 0.21 |
| D | 0.40 | 0.33 | 0.27 |

Figure 2:
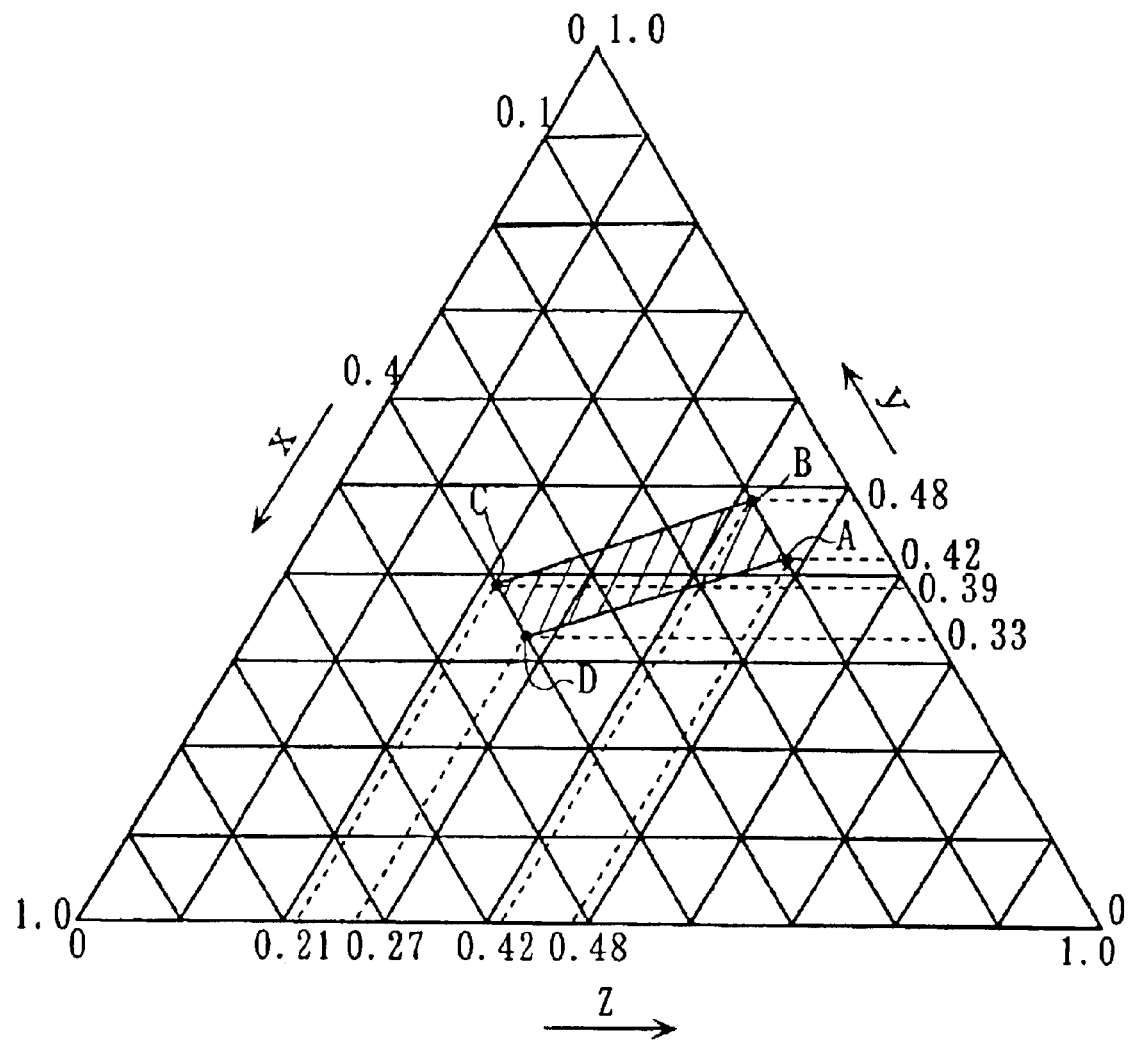
FIG. 2 is a ternary diagram showing an region of compositional variables x, y, and z of a piezoelectric ceramic composition according to the present invention.

Specifically, the piezoelectric ceramic composition is prepared such that the B site variables lie in the region designated by the hatched area in FIG. 2.

Also, the Ni—Nb molar proportion variable w satisfies the relationship $0.85 \leq w < 1$, and the molar content $\alpha$ of Pb, which is an A site constituent, is reduced by 0.005 to 0.050 from the stoichiometric ratio 1.000 so as to satisfy the relationship $0.950 \leq \alpha \leq 0.995$. Thus, the resulting piezoelectric ceramic composition can exhibit piezoelectric characteristics suitable for its use, such as relative dielectric constant $\epsilon r$, electromechanical coupling coefficient $K_{31}$, and piezoelectric strain constant $d_{31}$, without deterioration of mechanical strength. Also, the piezoelectric ceramic composition has an excellent thermal resistance.

The reasons why the B site variables, the Ni—Nb molar proportion variable w, and the Pb molar content $\alpha$ are set as above will now be explained.

(1) B Site Variables

Ternary compositions expressed by formula (1), essentially composed of $Pb(Ni, Nb)O_3$—$PbTiO_3$—$PbZrO_3$, have been widely known as ceramic compositions exhibiting excellent piezoelectric characteristics.

Since a Ni—Nb variable x of less than 0.1 leads to a low molar content of (Ni, Nb), however, the piezoelectric strain constant $d_{31}$ can not be increased even if the Pb molar content $\alpha$ is reduced to be lower than the stoichiometric ratio. In contrast, a Ni—Nb variable x of more than 0.4 can increase piezoelectric strain constant $d_{31}$ and other piezoelectric characteristics. However, it seriously reduces the Curie temperature Tc to degrade the thermal resistance.

Also, an excessively high or low Ti variable y negatively affects the piezoelectric characteristics even if the Ni—Nb variable x lies in the range of 0.1 to 0.4.

Hence, if the B site variables lie outside the hatched area in FIG. 2, the piezoelectric strain constant $d_{31}$ and other piezoelectric characteristics or the thermal resistance is degraded.

In this embodiment, therefore, the B site variables are set in the hatched area in FIG. 2, that is, the region surrounded by four points A, B, C, and D shown Table 1.

(2) Ni—Nb Molar Proportion Variable w

It has been known that the piezoelectric strain constant $d_{31}$ is increased in PNN-PZT piezoelectric ceramic compositions by setting the donor content in excess.

The ionic charge number of the Ni ion is +2 and is, hence, smaller than that of $Ti^{4+}$ and $Zr^{4+}$. The ionic charge number of the Nb ion is +5 and is, hence, larger than $Ti^{4+}$ and $Zr^{4+}$. Hence, Ni functions as an acceptor and Nb functions as a donor. Therefore, by reducing the Ni/Nb ratio to be lower than the stoichiometric ratio 1/2 so that the Nb content is set in excess, the donor content becomes excessive, and, consequently, the piezoelectric strain constant $d_{31}$ can be increased.

If the Ni—Nb molar proportion variable w is reduced to less than 0.85, however, the Nb content becomes too much excessive, and, consequently, a Pb—Nb—O pyrochlore phase (heterogeneous phase) is easily produced when the ceramic powder mixture is calcined, and the sintering characteristics are negatively affected. In contrast, the size of the particles constituting the composition increases if the Ni—Nb molar proportion variable w is increased to 1 or more. Consequently, a fracture or a crack is liable to occur during manufacture and the mechanical strength is degraded.

In this embodiment, therefore, the Ni—Nb molar proportion variable w is set so as to satisfy the relationship $0.85 \leq w < 1$.

(3) Pb Molar Content $\alpha$

If the Pb molar content $\alpha$ is set lower than the stoichiometric ratio in PNN-PZT ceramic materials, Ni is precipitated in grain boundaries, and, accordingly, the Nb content further increases. Therefore, by reducing the Pb molar content $\alpha$ from the stoichiometric ratio under the condition where the Ni—Nb molar proportion variable w is set to be $0.85 \leq w < 1$ so that the Nb content increases to excess, the Nb (donor) content is further increased, and, consequently, the piezoelectric strain constant $d_{31}$ can be further increased.

If the Pb molar content $\alpha$ is reduced to be lower than 0.950, however, the Pb molar content $\alpha$ is too low to allow the B site constituents to form a solid solution completely. Thus, the B site constituents are precipitated, and the crystallinity is negatively affected. In contrast, if the Pb molar content $\alpha$ is set more than 0.995, Ni cannot be precipitated in grain boundaries due to the insufficient reduction of Pb.

In this embodiment, therefore, the Pb molar content $\alpha$ is set so as to satisfy the relationship $0.950 \leq \alpha \leq 0.995$.

By reducing the Pb molar content $\alpha$ to be lower than the stoichiometric ratio, the piezoelectric strain constant $d_{31}$ and other piezoelectric characteristics can be enhanced, with the B site variables x, y, and z set as above. Specifically, when, for example, the monolithic piezoelectric element is applied to a use which gives the thermal resistance a higher propriety than the piezoelectric strain constant $d_{31}$, the B site variables are set so as to enhance the thermal resistance. By setting the Pb molar content $\alpha$ to be $0.950 \leq \alpha \leq 0.995$, however, the piezoelectric strain constant $d_{31}$ can also be increased. When the monolithic piezoelectric element is applied to a use giving the piezoelectric strain constant $d_{31}$ a higher propriety than the thermal resistance, the B site variables are set so as to enhance the piezoelectric strain constant $d_{31}$. In this instance, by setting the Pb molar content $\alpha$ to be $0.950 \leq \alpha \leq 0.995$, the piezoelectric strain constant $d_{31}$ can be further increased.

As described above, by reducing the Pb molar content $\alpha$ to be lower than the stoichiometric ratio under the condition where the B site variables are set according to the use of the monolithic piezoelectric element, piezoelectric characteristics, such as piezoelectric strain constant $d_{31}$, electromechanical coupling coefficient $K_{31}$, and relative dielectric constant $\epsilon r$, can be enhanced.

A method for manufacturing the monolithic piezoelectric element will now be described in detail.

Ceramic raw materials $Pb_3O_4$, $ZrO_2$, $TiO_2$, NiO and $Nb_2O_5$ weighed out in predetermined amounts are placed in a ball mill containing a pulverization medium formed of, for example, zirconia, and are pulverized and mixed. Then, the resulting powder mixture is calcined at a predetermined temperature. Thus, a PNN-PZT ceramic powder mixture is yielded in which the B site variables lie in the hatched area in FIG. 2, the Ni—Nb molar proportion variable w is $0.85 \leq w < 1$, and the Pb molar content $\alpha$ is $0.950 \leq \alpha \leq 0.995$.

Next, a solvent and a dispersant are added to the ceramic powder mixture, followed by wet pulverization. An organic binder and any predetermined additive(s) are further added to the mixture, followed by wet pulverization to prepare a slurry. The slurry is subjected to a doctor blade technique to form ceramic green sheets (hereinafter, simply referred to as ceramic sheets).

Next, the ceramic sheets are screen-printed with an internal electrode paste containing Ag and Pd at a predetermined weight ratio (for example, 70:30). A predetermined number of the screen-printed ceramic sheets are layered. Ceramic sheets not screen-printed are disposed on the top and bottom surfaces of the layered ceramic sheets, followed by contact-bonding to prepare a laminate. The resulting laminate is placed in an alumina sagger and the binder is removed from the laminate. Then, the laminate is heat-treated at a predetermined temperature to yield the piezoelectric ceramic base element 1. The ceramic base element 1 is provided with external electrodes formed of Ag or the like on both ends thereof. Thus, a monolithic piezoelectric element is completed.

Ny reducing the Pb molar content $\alpha$ of the PNN-PZT piezoelectric ceramic composition containing an excess amount of Nb, by 0.005 to 0.050 from the stoichiometric ratio in this embodiment, Ni is precipitated in grain boundaries. Consequently, the donor content of the piezoelectric ceramic composition constituting the piezoelectric ceramic base element 1 is further increased. As a result, the formation of a pyrochlore phase (heterogeneous phase) is prevented and, thus, the piezoelectric characteristics, such as piezoelectric strain constant $d_{31}$, electromechanical coupling coefficient $K_{31}$, and relative dielectric constant $\epsilon r$, can be enhanced.

Also, by reducing the Pb molar content $\alpha$ of the piezoelectric ceramic composition from the stoichiometric ratio in the monolithic piezoelectric element, Ni is further precipitated in the grain boundaries to compensate for the diffusion into the ceramic base element of Ag, which is a constituent of the internal electrodes. As a result, the donor content in the piezoelectric ceramic composition is further increased, so that the deterioration of piezoelectric characteristics due to the electrode material can be canceled out. Thus, the resulting monolithic piezoelectric element can exhibit excellent piezoelectric characteristics.

By suitably setting the B site variables according to the use of the resulting piezoelectric element in the piezoelectric ceramic composition of the present invention, and by reducing the Pb molar content by a predetermined amount from the stoichiometric ratio, the piezoelectric characteristics can be enhanced. Thus, the piezoelectric ceramic composition leads to a high performance monolithic piezoelectric element suitably used for various types of piezoelectric devices, such as piezoelectric actuators, piezoelectric buzzers, and piezoelectric sensors.

Although the Pb molar content a is set in the range of 0.950 to 0.995, in this embodiment, composition formula (1) may be modified to following formula (2). The composition expressed by formula (2) can also exhibit piezoelectric characteristics similar to those of the composition of formula (1).

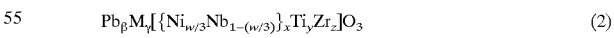  (2)

where M is at least one element selected from the group consisting of Sr, Ca and Ba, and $\gamma$ and $\beta$ satisfy the relationships: $\gamma \leq 0.10$ and $0.950 \leq \beta + \gamma \leq 0.995$.

Specifically, by substituting at least one of Sr, Ca and Ba for about 0.10 (about 10 mole percent) or less of Pb whose molar content is reduced to 0.950 to 0.995, the resulting piezoelectric ceramic composition and monolithic piezoelectric element including the piezoelectric ceramic base element 1 formed of the piezoelectric ceramic composition can exhibit excellent piezoelectric characteristics and be suitable for various applications.

In this instance, the monolithic piezoelectric element is manufactured by the same method and procedure as above, except that $SrCO_3$, $CaCO_3$ or $BaCO_3$ is added to the ceramic materials $Pb_3O_4$, $ZrO_2$, $TiO_2$ and NiO.

EXAMPLES

Examples of the present invention will now be described.

First Example

Piezoelectric elements were prepared using different compositions expressed by composition formula (1) in which α, w, x, y, and z were varied, and piezoelectric characteristics of the piezoelectric elements were evaluated.

Samples 1 to 30

Figure 3:
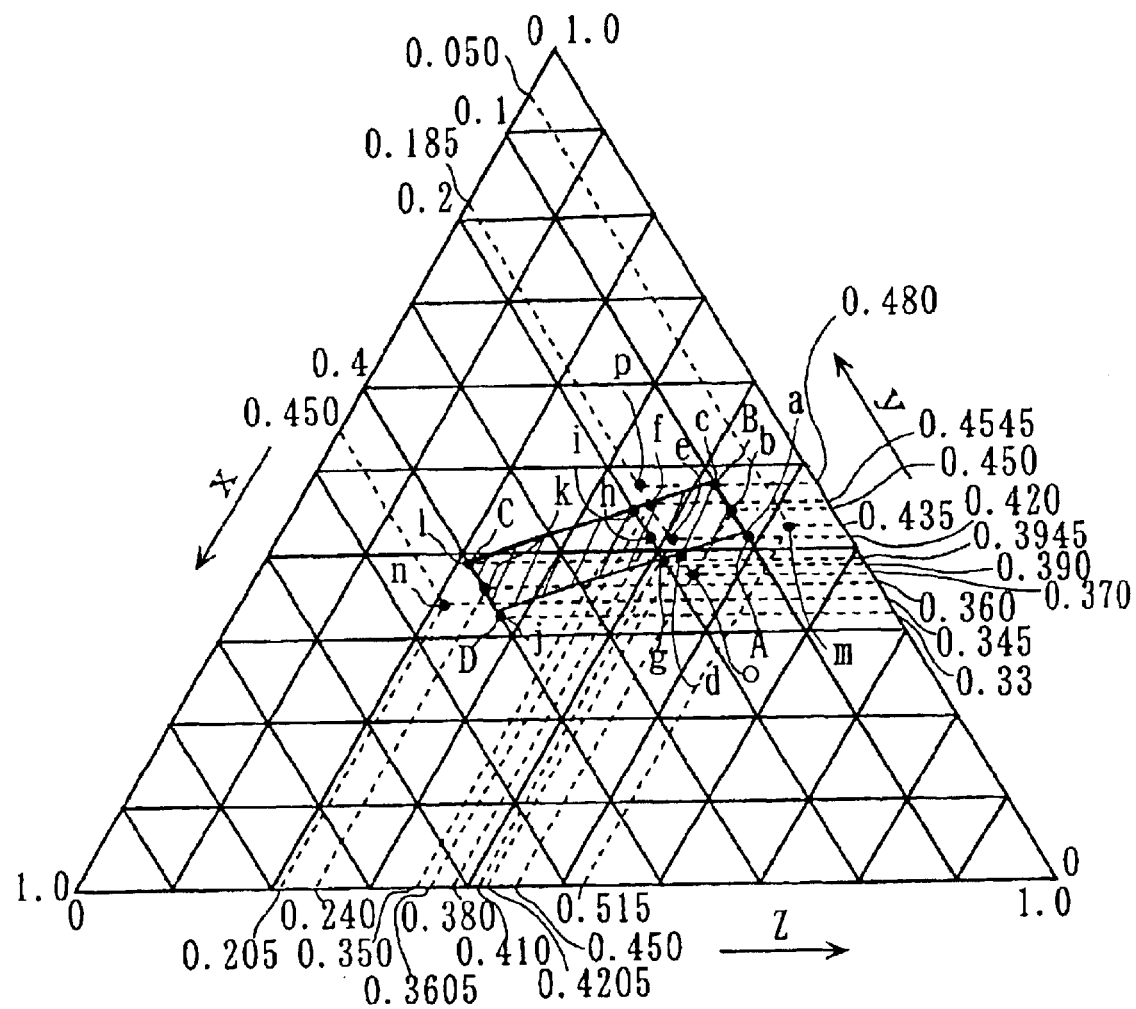
FIG. 3 is a ternary diagram showing a region of compositional variables x, y, and z of piezoelectric ceramic compositions used for examples of the present invention.

$Pb_3O_4$, $TiO_2$, $ZrO_2$, NiO and $Nb_2O_5$ were weighed out so that α was 0.985 or 1.000; w was 0.950; and x, y, and z lay at points a to p in FIG. 3.

These materials were placed in a ball mill together with ion-exchanged water, acting as a solvent, and wet-mixed. The resulting mixture was dried, granulated and calcined at a temperature of 700 to 950° C. Then, a solvent and a dispersant were added to the calcined mixture and it was wet-pulverized. After further adding an organic binder and a predetermined additive, the mixture was wet-mixed to prepare a slurry. The slurry was formed into a sheet by a doctor blade technique. The sheet was cut out to pieces having a predetermined size. Thus ceramic sheets were prepared.

Next, some of the ceramic sheets were screen-printed with an internal electrode paste containing Ag and Pd at a ratio of 70:30. Three screen-printed ceramic sheets were layered on one another. Two ceramic sheets not screen-printed were disposed on the top and bottom surfaces of the layered ceramic sheets, followed by contact-bonding to prepare a laminate.

The laminate was fired at a temperature of 1100° C. for 2 hours to yield a piezoelectric ceramic base element (sintered ceramic) including ceramic layers, each having a thickness of 20 to 40 μm. Ag was deposited on both ends of the piezoelectric ceramic base element to form external electrodes, and polarization was performed in an electric field of 2.0 to 3.5 kV/mm. Thus, samples of the monolithic piezoelectric element were completed.

Samples 31 to 35

$Pb_3O_4$, $ZrO_2$, $TiO_2$, NiO and $Nb_2O_5$ were weighed out so that w was 0.950; x, y, and z lay at point e (x: 0.185, y: 0.420, z: 0.395) in FIG. 3; and α was in the range of 0.940 to 0.995, and samples of the monolithic piezoelectric element were prepared by the same method and procedure as in Samples 1 to 30.

Samples 36 to 42

$Pb_3O_4$, $ZrO_2$, $TiO_2$, NiO and $Nb_2O_5$ were weighed out so that α was 0.985; x, y, and z lay at point e (x: 0.185, y: 0.420, z: 0.395) in FIG. 3; and w was in the range of 0.800 to 1.000, and samples of the monolithic piezoelectric element were prepared by the same method and procedure as in Samples 1 to 30.

Each sample was subjected to measurements of relative dielectric constant εr, electromechanical coupling coefficient $K_{31}$, piezoelectric strain constant $d_{31}$ and Curie temperature Tc.

The relative dielectric constant εr, electromechanical coupling coefficient $K_{31}$, and piezoelectric strain constant $d_{31}$ were measured with a RF impedance analyzer (HP4219A manufactured by Hewlett-Packard Co.) by a resonance and anti-resonance method.

Also, the change in relative dielectric constant εr with temperature was measured, and the temperature when the relative dielectric constant εr was highest is defined as the Curie temperature Tc.

Table 2 shows the compositions of Samples 1 to 42, and Table 3 shows the results of the above-described measurements.

TABLE 2

$Pb_\alpha[\{Ni_{w/3}Nb_{1-(w/3)}\}_xTi_yZr_z]O_3$

| Sample | a | w | x | y | z | Point in FIG. 3 |
|---|---|---|---|---|---|---|
| 1 | 0.985 | 0.950 | 0.100 | 0.420 | 0.480 | a |
| 2* | 1.000 | 0.950 | 0.100 | 0.420 | 0.480 | a |
| 3 | 0.985 | 0.950 | 0.100 | 0.450 | 0.450 | b |
| 4* | 1.000 | 0.950 | 0.100 | 0.450 | 0.450 | b |
| 5 | 0.985 | 0.950 | 0.100 | 0.480 | 0.420 | c |
| 6* | 1.000 | 0.950 | 0.100 | 0.480 | 0.420 | c |
| 7 | 0.985 | 0.950 | 0.185 | 0.3945 | 0.4205 | d |
| 8* | 1.000 | 0.950 | 0.185 | 0.3945 | 0.4205 | d |
| 9 | 0.985 | 0.950 | 0.185 | 0.420 | 0.395 | e |
| 10* | 1.000 | 0.950 | 0.185 | 0.420 | 0.395 | e |
| 11 | 0.985 | 0.950 | 0.185 | 0.4545 | 0.3605 | f |
| 12* | 1.000 | 0.950 | 0.185 | 0.4545 | 0.3605 | f |
| 13 | 0.985 | 0.950 | 0.200 | 0.390 | 0.410 | g |
| 14* | 1.000 | 0.950 | 0.200 | 0.390 | 0.410 | g |
| 15 | 0.985 | 0.950 | 0.200 | 0.420 | 0.380 | h |
| 16* | 1.000 | 0.950 | 0.200 | 0.420 | 0.380 | h |
| 17 | 0.985 | 0.950 | 0.200 | 0.450 | 0.350 | i |
| 18* | 1.000 | 0.950 | 0.200 | 0.450 | 0.350 | i |
| 19 | 0.985 | 0.950 | 0.400 | 0.330 | 0.270 | j |
| 20* | 1.000 | 0.950 | 0.400 | 0.330 | 0.270 | j |
| 21 | 0.985 | 0.950 | 0.400 | 0.360 | 0.240 | k |
| 22* | 1.000 | 0.950 | 0.400 | 0.360 | 0.240 | k |
| 23 | 0.985 | 0.950 | 0.400 | 0.390 | 0.210 | l |
| 24* | 1.000 | 0.950 | 0.400 | 0.390 | 0.210 | l |
| 25* | 0.985 | 0.950 | 0.050 | 0.435 | 0.515 | m |
| 26* | 1.000 | 0.950 | 0.050 | 0.435 | 0.515 | m |
| 27* | 0.985 | 0.950 | 0.450 | 0.345 | 0.205 | n |
| 28* | 1.000 | 0.950 | 0.450 | 0.345 | 0.205 | n |
| 29* | 0.985 | 0.950 | 0.185 | 0.370 | 0.445 | o |
| 30* | 0.985 | 0.950 | 0.185 | 0.480 | 0.335 | p |
| 31* | 0.940 | 0.950 | 0.185 | 0.420 | 0.395 | e |
| 32 | 0.950 | 0.950 | 0.185 | 0.420 | 0.395 | e |
| 33 | 0.965 | 0.950 | 0.185 | 0.420 | 0.395 | e |
| 34 | 0.990 | 0.950 | 0.185 | 0.420 | 0.395 | e |
| 35 | 0.995 | 0.950 | 0.185 | 0.420 | 0.395 | e |
| 36* | 0.985 | 1.000 | 0.185 | 0.420 | 0.395 | e |
| 37 | 0.985 | 0.990 | 0.185 | 0.420 | 0.395 | e |
| 38 | 0.985 | 0.980 | 0.185 | 0.420 | 0.395 | e |
| 39 | 0.985 | 0.960 | 0.185 | 0.420 | 0.395 | e |
| 40 | 0.985 | 0.900 | 0.185 | 0.420 | 0.395 | e |
| 41 | 0.985 | 0.850 | 0.185 | 0.420 | 0.395 | e |
| 42* | 0.985 | 0.800 | 0.185 | 0.420 | 0.395 | e |

*Outside of the invention

TABLE 3

| Sample | Relative dielectric constant | Electromechanical coupling coefficient $K_{31}$ (%) | Piezoelectric strain constant (pC/N) | Curie temperature Tc (° C.) |
|---|---|---|---|---|
| 1 | 1429 | 36.0 | 146 | 310 |
| 2* | 1288 | 33.2 | 126 | 310 |
| 3 | 1860 | 37.2 | 182 | 320 |
| 4* | 1709 | 34.0 | 155 | 320 |
| 5 | 1778 | 32.5 | 156 | 330 |
| 6* | 1588 | 28.9 | 127 | 330 |
| 7 | 1825 | 38.8 | 181 | 280 |
| 8* | 1719 | 34.9 | 156 | 280 |
| 9 | 2475 | 39.0 | 224 | 290 |
| 10* | 2185 | 35.2 | 184 | 290 |
| 11 | 2460 | 34.8 | 200 | 300 |
| 12* | 2051 | 30.9 | 157 | 300 |
| 13 | 1835 | 38.8 | 181 | 265 |
| 14* | 1725 | 35.0 | 157 | 265 |
| 15 | 2510 | 39.1 | 226 | 275 |
| 16* | 2199 | 35.3 | 185 | 275 |
| 17 | 2472 | 34.9 | 201 | 285 |
| 18* | 2068 | 31.0 | 159 | 285 |
| 19 | 3015 | 38.7 | 235 | 180 |
| 20* | 2888 | 35.0 | 204 | 180 |
| 21 | 3889 | 39.1 | 291 | 190 |
| 22* | 3495 | 36.0 | 246 | 190 |
| 23 | 3749 | 35.9 | 261 | 200 |
| 24* | 3100 | 31.9 | 202 | 200 |
| 25* | 1268 | 32.2 | 122 | 340 |
| 26* | 1011 | 29.1 | 97 | 340 |
| 27* | 4295 | 37.7 | 296 | 165 |
| 28* | 3612 | 33.9 | 235 | 165 |
| 29* | 889 | 29.5 | 92 | 270 |
| 30* | 1325 | 25.1 | 97 | 310 |
| 31* | | Not sintered well | | |
| 32 | 2092 | 35.8 | 188 | 290 |
| 33 | 2189 | 37.2 | 200 | 290 |
| 34 | 2380 | 38.0 | 214 | 290 |
| 35 | 2295 | 37.0 | 200 | 290 |
| 36* | | Many fractures and cracks | | |
| 37 | 2299 | 37.9 | 208 | 290 |
| 38 | 2387 | 38.6 | 217 | 290 |
| 39 | 2438 | 38.8 | 221 | 290 |
| 40 | 2295 | 37.1 | 204 | 290 |
| 41 | 2190 | 36.1 | 190 | 290 |
| 42* | | Not sintered well | | |

*Outside of the invention

The samples marked with an asterisk * in Tables 2 and 3 are beyond the scope of the present invention. Electromechanical coupling coefficients $K_{31}$ and piezoelectric strain constants $d_{31}$ are represented with absolute values.

In Samples 1 to 24, while w was set at 0.950, which is a value within the scope of the invention, and the B site variables were set at points a to 1 in the hatched area in FIG. 3, a comparison is performed between the cases where α is set at 0.985 and 1.000.

Tables 2 and 3 suggest that by reducing α from the stoichiometric ratio 1.000 to 0.985 while the B site variables lie at any one of points a to 1, the relative dielectric constant εr, the electromechanical coefficient $K_{31}$, and piezoelectric strain constant $d_{31}$ are increased; hence, the piezoelectric characteristics are enhanced. Specifically, by reducing α from the stoichiometric ratio 1.000 to 0.985, the piezoelectric characteristics of a piezoelectric ceramic composition whose B site variables are set according to the use of the resulting monolithic piezoelectric element, such as for piezoelectric actuators, piezoelectric buzzers, or piezoelectric sensors, can be further enhanced. For example, the Curie temperature Tc, which is an index of the thermal resistance, varies from 180 to 330° C., among points a to 1. The Curie temperature Tc of Samples 3 and 4, whose B site variables lie at point b, is as high as 320° C., and Samples 3 and 4 are therefore suitable for uses requiring thermal resistance. In Samples 21 and 22, whose B site variables lie at point k, the Curie temperature Tc is as low as 190° C., but the piezoelectric strain constant $d_{31}$ is as high as 246 pC/N even though α is 1.000. Samples 21 and 22 are therefore suitable for uses requiring a high piezoelectric strain constant $d_{31}$, but not thermal resistance. Specifically, if a thermal resistance is required, the B site variables are set at point b. In contrast, if a high piezoelectric strain constant $d_{31}$ rather than thermal resistance is required, the B side variables are set at point k. Then, by reducing α from the stoichiometric ratio 1.000 to 0.985, the piezoelectric strain constant $d_{31}$ of the samples whose B site variables are lie at point b is increased from 155 pC/N to 182 pC/N, and the piezoelectric strain constant $d_{31}$ of samples whose B site variables lie at point k is increased from 246 pC/N to 291 pC/N.

As a result of the first example, it has been shown that a piezoelectric ceramic composition whose B side variables are set according to use can lead to enhanced piezoelectric characteristics, as shown Samples 1 to 24.

At points a to i, that is, in the region satisfying the relationship $0.1 \leq x \leq 0.2$, the Curie temperature Tc is 265° C. or more, and is so high as to resist reflow soldering for surface mounting of piezoelectric devices using the monolithic piezoelectric element. Furthermore, the piezoelectric characteristics can be enhanced by reducing α from the stoichiometric ratio 1.000 to 0.985.

In Samples 25 and 26, while the B site variables are set at point m, a comparison is performed between the cases where α is set at 0.985 and 1.000. Since the (Ni, Nb) variable x is lower than 0.1 and is 0.050, the piezoelectric strain constant $d_{31}$ is increased to no more than about 122 pC/N and, hence, the piezoelectric characteristics are inferior, even though the Pb molar content α is reduced.

In Samples 27 and 28, while the B site variables are set at point n, a comparison is performed between the cases where α is set at 0.985 and 1.000. Since the (Ni, Nb) variable x is higher than 0.4 and is 0.450, the Curie temperature Tc becomes as low as 165° C. and, hence, the thermal resistance is inferior. In Samples 29 and 30, the B site variables are set at point o and p, and α is set at 0.985. The piezoelectric strain constant $d_{31}$ is less than 100 pC/N and, hence, the piezoelectric characteristics are seriously degraded because the Ti variable y is 0.370 or 0.480, that is, outside the hatched area in FIG. 3. In Samples 31 to 35, the B site variables are set at point e, and w and a are respectively set at 0.950 and in the range of 0.940 to 0.995.

Sample 31 was not sintered well because the Pb molar content α is 0.940. It has been shown that a Pb molar content α of less than 0.950 negatively affects sintering.

In contrast, the piezoelectric strain constant $d_{31}$ of Samples 32 to 35 is increased in comparison with the case where α is set at 1.000 (Sample 10). It has been shown that a Pb molar content α in the range of 0.950 to 0.995 leads to an increased piezoelectric strain constant $d_{31}$.

In Samples 36 to 42, the B site variables are set at point e, and the Pb molar content α and the Ni—Nb molar proportion variable w are respectively set at 0.985 and in the range of 0.800 to 1.000. Sample 36 exhibited the occurrence of a fracture and a crack in the piezoelectric ceramic base element because the Ni/Nb ratio was increased to more than the stoichiometric ratio 1/2 to increase the particle size. Sample 42 was not sintered well due to a low variable w of 0.800. It has been shown that a Ni—Nb molar proportion variable w of less than 0.850 negatively affects sintering.

In contrast, the piezoelectric strain constant $d_{31}$ of Samples 37 to 41 is increased in comparison with the case where α is set at 1.000 (Sample 10) because w is set in the range of 0.850 to 0.990 and α is set at 0.985.

Second Example

Samples of the monolithic piezoelectric element were prepared in which Sr, Ca or Ba was substituted for part of the Pb of Sample 9 in the first example. The piezoelectric characteristics of the resulting samples were evaluated.
Samples 51 to 54
$Pb_3O_4$, $TiO_2$, $ZrO_2$, NiO, $Nb_2O_5$ and $SrCO_3$ were weighed out so that part of the Pb of Sample 9 was replaced with Sr, and the Pb molar ratio β and the Sr molar ratio γ were respectively set in the ranges of 0.825 to 0.965 and 0.02 to 0.16. The materials were processed to yield monolithic piezoelectric elements by the same method and procedure as in the first example.
Samples 55 to 57
$Pb_3O_4$, $TiO_2$, $ZrO_2$, NiO, $Nb_2O_5$ and $CaCO_3$ were weighed out so that Ca was substituted for part of the Pb, instead of the Sr in Samples 51, 53, and 54. The materials were processed to yield monolithic piezoelectric elements by the same method and procedure as in the first example.
Samples 58 to 60
$Pb_3O_4$, $TiO_2$, $ZrO_2$, NiO, $Nb_2O_5$ and $BaCO_3$ were weighed out so that Ba was substituted for part of the Pb, instead of the Sr in Samples 51, 53, and 54. The materials were processed to yield monolithic piezoelectric elements by the same method and procedure as in the first example.

Each sample was subjected to measurements of relative dielectric constant εr, electromechanical coupling coefficient $K_{31}$, piezoelectric strain constant $d_{31}$ and Curie temperature Tc to evaluate the piezoelectric characteristics, as in the first example.

Table 4 shows the compositions of Samples 51 to 60, and Table 5 shows the results of the above-described measurements.

TABLE 4

$Pb_\beta M_\gamma[\{Ni_{w/3}Nb_{1-(w/3)}\}_x Ti_y Zr_z]O_3$ (M = Sr, Ca, Ba)

| | β | γ | | | | | | | | |
|---|---|---|---|---|---|---|---|---|---|---|
| Sample | Pb | Sr | Ca | Ba | β + γ | w | x | y | z | Point in FIG. 3 |
| 51 | 0.965 | 0.02 | — | — | 0.985 | 0.950 | 0.185 | 0.420 | 0.395 | e |
| 52 | 0.935 | 0.05 | — | — | 0.985 | 0.950 | 0.185 | 0.420 | 0.395 | e |
| 53 | 0.885 | 0.10 | — | — | 0.985 | 0.950 | 0.185 | 0.420 | 0.395 | e |
| 54* | 0.825 | 0.16 | — | — | 0.985 | 0.950 | 0.185 | 0.420 | 0.395 | e |
| 55 | 0.965 | — | 0.02 | — | 0.985 | 0.950 | 0.185 | 0.420 | 0.395 | e |
| 56 | 0.885 | — | 0.10 | — | 0.985 | 0.950 | 0.185 | 0.420 | 0.395 | e |
| 57* | 0.825 | — | 0.16 | — | 0.985 | 0.950 | 0.185 | 0.420 | 0.395 | e |
| 58 | 0.965 | — | — | 0.02 | 0.985 | 0.950 | 0.185 | 0.420 | 0.395 | e |
| 59 | 0.885 | — | — | 0.10 | 0.985 | 0.950 | 0.185 | 0.420 | 0.395 | e |
| 60* | 0.825 | — | — | 0.16 | 0.985 | 0.950 | 0.185 | 0.420 | 0.395 | e |

*Outside of the invention

TABLE 5

| Sample | Relative dielectric constant | Electromechanical coupling coefficient $K_{31}$ (%) | Piezoelectric strain constant (pC/N) | Curie temperature Tc (° C.) |
|---|---|---|---|---|
| 51 | 2466 | 38.5 | 221 | 270 |
| 52 | 3008 | 38.2 | 246 | 220 |
| 53 | 3716 | 38.4 | 278 | 180 |
| 54* | | Not sintered well | | |

TABLE 5-continued

| Sample | Relative dielectric constant | Electromechanical coupling coefficient $K_{31}$ (%) | Piezoelectric strain constant (pC/N) | Curie temperature Tc (° C.) |
|---|---|---|---|---|
| 55 | 2416 | 38.4 | 218 | 265 |
| 56 | 3521 | 36.8 | 257 | 170 |
| 57* | | Not sintered well | | |
| 58 | 2409 | 38.3 | 216 | 270 |
| 59 | 3538 | 37.1 | 260 | 180 |
| 60* | | Not sintered well | | |

*Outside of the invention

The samples marked with an asterisk in Tables 4 and 5 are beyond the scope of the present invention.

As shown in Samples 51 to 53, the piezoelectric strain constant $d_{31}$ is increased in comparison with the case where the Pb content is set at the stoichiometric ratio 1.000 (Sample 10) even when Sr is substituted for part of the Pb. Furthermore, as the Sr molar content γ increases, the piezoelectric strain constant $d_{31}$ increases. However, if the Sr molar content γ becomes as high as 0.16, the composition is not sintered well.

Specifically, Samples 51 to 54 show that, by substituting Sr for about 10 mole percent (about 0.10) or less of Pb whose molar content is reduced, a high-performance piezoelectric element exhibiting a high piezoelectric strain constant $d_{31}$ can be achieved, as in the first example.

Samples 55 to 57 and 58 to 60 show, as above, that, by substituting Ca or Ba for about 10 mole percent (about 0.10) or less of Pb, whose molar content is reduced, a high-performance piezoelectric element exhibiting a high piezoelectric strain constant $d_{31}$ can be achieved, as in the first example.

What is claimed is:

1. A piezoelectric ceramic composition comprising Pb, Ni, Nb, Ti, Zr and O, the composition being expressed by the formula $$Pb_\beta M_\gamma [\{Ni_{w/3} Nb_{1-(w/3)}\}_x Ti_y Zr_z] O_3$$

wherein M is at least one element selected from the group consisting of Sr, Ca and Ba, γ is 0 to about 0.1, γ and β satisfy the relationships: $γ ≤ 0.10$ and $0.950 ≤ β+γ ≤ 0.995$, x, y, and z lie on the lines connecting points A, B, C and D in a ternary diagram or within the region surrounded by the lines, w satisfies the relationship $0.85 ≤ w < 1.00$, and α is β+γ and is lower than the stoichiometric ratio, and wherein points A, B, C, and D are:

A: (x, y, z)=(0.10, 0.42, 0.48);
B: (x, y, z)=(0.10, 0.48, 0.42);
C: (x, y, z)=(0.40, 0.39, 0.21); and
D: (x, y, z)=(0.40, 0.33, 0.27).

2. A piezoelectric ceramic composition according to claim 1, wherein γ is 0.

3. A piezoelectric ceramic composition according to claim 2, wherein $0.85 ≤ w ≤ 0.99$.

4. A piezoelectric ceramic composition according to claim 3, wherein α satisfies the relationship $0.985 ≤ α$.

5. A piezoelectric ceramic composition according to claim 3, wherein α satisfies the relationship $0.950 ≤ α$.

6. A piezoelectric ceramic composition according to claim 2, wherein α satisfies the relationship $0.950 ≤ α ≤ 0.995$.

7. A piezoelectric ceramic composition according to claim 2, wherein $0.1 ≤ x ≤ 0.2$.

8. A piezoelectric ceramic composition according to claim 1, wherein γ is greater than 0 and a part of the Pb is thereby replaced with at least one element selected from the group consisting of Sr, Ca and Ba.

9. A piezoelectric ceramic composition according to claim 8, wherein $0.85 ≤ w ≤ 0.99$.

10. A piezoelectric ceramic composition according to claim 9, wherein α satisfies the relationship $0.985 ≤ α$.

11. A piezoelectric ceramic composition according to claim 9, wherein α satisfies the relationship $0.950 ≤ α$.

12. A piezoelectric ceramic composition according to claim 8, wherein α satisfies the relationship $0.950 ≤ α ≤ 0.995$.

13. A piezoelectric ceramic composition according to claim 8, wherein $0.1 ≤ x ≤ 0.2$.

14. A piezoelectric element comprising a ceramic base element comprising a piezoelectric ceramic composition as set forth in claim 8 and an internal electrode disposed in the ceramic base element.

15. A piezoelectric element according to claim 14, wherein the internal electrode comprises Ag.

16. A piezoelectric element comprising a ceramic base element comprising a piezoelectric ceramic composition as set forth in claim 2 and an internal electrode disposed in the ceramic base element.

17. A piezoelectric element according to claim 16, wherein the internal electrode comprises Ag.

18. A piezoelectric element comprising a ceramic base element comprising a piezoelectric ceramic composition as set forth in claim 1 and an internal electrode disposed in the ceramic base element.

19. A piezoelectric element according to claim 18, wherein the internal electrode comprises Ag.

* * * * *